US011004381B2

(12) United States Patent
Ren et al.

(10) Patent No.: US 11,004,381 B2
(45) Date of Patent: May 11, 2021

(54) ARRAY SUBSTRATE COMPRISING AN ANTENNA, DRIVING METHOD AND DISPLAY DEVICE

(71) Applicants: ORDOS YUANSHENG OPTOELECTRONICS CO., LTD., Ordos (CN); BOE TECHNOLOGY GROUP CO., LTD., Beijing (CN)

(72) Inventors: Yanwei Ren, Beijing (CN); Yezhou Fang, Beijing (CN); Jingyi Xu, Beijing (CN); Xin Zhao, Beijing (CN); Min Liu, Beijing (CN); Chaochao Sun, Beijing (CN)

(73) Assignees: ORDOS YUANSHENG OPTOELECTRONICS CO., LTD., Ordos (CN); BOE TECHNOLOGY GROUP CO., LTD., Beijing (CN)

(*) Notice: Subject to any disclaimer, the term of this patent is extended or adjusted under 35 U.S.C. 154(b) by 32 days.

(21) Appl. No.: 16/343,105

(22) PCT Filed: Sep. 20, 2018

(86) PCT No.: PCT/CN2018/106716
§ 371 (c)(1),
(2) Date: Apr. 18, 2019

(87) PCT Pub. No.: WO2019/062639
PCT Pub. Date: Apr. 4, 2019

(65) Prior Publication Data
US 2019/0318682 A1    Oct. 17, 2019
US 2020/0312217 A9    Oct. 1, 2020

(30) Foreign Application Priority Data

Sep. 30, 2017 (CN) .......................... 201710922899.6

(51) Int. Cl.
*G09G 3/20*    (2006.01)
*H01L 23/66*   (2006.01)
(Continued)

(52) U.S. Cl.
CPC ........... *G09G 3/2092* (2013.01); *H01L 23/66* (2013.01); *H01L 27/124* (2013.01);
(Continued)

(58) Field of Classification Search
CPC ..... G09G 2300/023; G09G 2300/0426; G09G 2300/043; G09G 2370/16; G09G 3/20;
(Continued)

(56) References Cited

U.S. PATENT DOCUMENTS

2002/0192886 A1    12/2002  Inoue
2010/0267421 A1*   10/2010  Rofougaran ............ G06F 3/044
                                                        455/566
(Continued)

FOREIGN PATENT DOCUMENTS

CN    101308266 A    11/2008
CN    102931199 A    2/2013
(Continued)

OTHER PUBLICATIONS

PCT International Search Report, Application No. PCT/CN2018/106716, dated Dec. 27, 2018, 6 pages: with English translation.
(Continued)

*Primary Examiner* — Ram A Mistry
(74) *Attorney, Agent, or Firm* — Armstrong Teasdale LLP

(57) ABSTRACT

The present disclosure provides an array substrate and a display device for reducing the space occupied by the antenna inside the mobile phone, so as to reduce the thickness of the mobile phone and make the mobile phone thinner and lighter. The array substrate according to the present disclosure includes dummy signal lines and a conductive
(Continued)

portion. The dummy signal lines and the conductive portion are disposed in different layers. An insulating layer is disposed between the dummy signal lines and the conductive portion. A via is disposed on the insulating layer. The dummy signal line is connected to the conductive portion through the via. The dummy signal line and the conductive portion are used to form an antenna.

15 Claims, 7 Drawing Sheets

(51) Int. Cl.
  *H01L 27/12* (2006.01)
  *H01Q 1/24* (2006.01)
  *H01Q 1/38* (2006.01)
  *H01Q 1/40* (2006.01)
  *H04M 1/02* (2006.01)

(52) U.S. Cl.
  CPC ......... *H01L 27/1255* (2013.01); *H01Q 1/243* (2013.01); *H01Q 1/38* (2013.01); *H01Q 1/40* (2013.01); *H04M 1/0266* (2013.01); *G09G 2370/16* (2013.01); *H01L 2223/6677* (2013.01); *H04M 2201/38* (2013.01)

(58) Field of Classification Search
  CPC ............... G09G 3/2074; G09G 3/2092; H01L 2223/6677; H01L 23/66; H01L 27/124; H01L 27/1255; H01L 29/78633; H01Q 1/243; H01Q 1/38; H01Q 1/40; H04B 5/00; H04M 1/0266; H04M 2201/38
  See application file for complete search history.

(56) References Cited

U.S. PATENT DOCUMENTS

| | | | |
|---|---|---|---|
| 2010/0270868 A1 | 10/2010 | Hanaoka et al. | |
| 2015/0048329 A1* | 2/2015 | Kim | H01L 51/5253 257/40 |
| 2016/0328057 A1* | 11/2016 | Chai | G06F 3/0412 |
| 2017/0047361 A1* | 2/2017 | Xu | H01L 27/13 |

FOREIGN PATENT DOCUMENTS

| | | |
|---|---|---|
| CN | 103728762 A | 4/2014 |
| CN | 104485334 A | 4/2015 |
| CN | 105224136 A | 1/2016 |
| CN | 105808014 A | 7/2016 |
| CN | 107731855 A | 2/2018 |

OTHER PUBLICATIONS

PCT Written Opinion, Application No. PCT/CN2018/106716, dated Dec. 27, 2018, 5 pages.: with English translation of relevant part.
China First Office Action, Application No. 201710922899.6, dated Aug. 27, 2019, 16 pps.: with English translation.

* cited by examiner

ARRAY SUBSTRATE COMPRISING AN ANTENNA, DRIVING METHOD AND DISPLAY DEVICE

CROSS REFERENCE TO RELATED APPLICATIONS

This patent application is a National Stage Entry of PCT/CN2018/106716 filed on Sep. 20, 2018, which claims the benefit and priority of Chinese Patent Application No. 201710922899.6 filed on Sep. 30, 2017, the disclosures of which are incorporated by reference herein in their entirety as part of the present application.

BACKGROUND

The present disclosure relates to the field of display technologies, and in particular, to an array substrate, a driving method, and a display device.

In the communications industry, the mobile phone market is facing fiercest competition. A thin and light mobile phone is a hot trend in today's mobile phone design. Whether the mobile phone can be thin or light has become the most important part of mobile phone design, which directly affects whether mobile phone products produced by mobile phone manufacturers can enter the high-end market.

Nowadays, technologies such as Bluetooth, WIFI, and Near Field Communication (NFC) have been widely used, and, especially for the mobile phones, almost become standard configurations. However, the signal transmission of these communication technologies requires an antenna which however usually occupies a large internal space of the mobile phone, making it difficult to thin the mobile phone.

BRIEF DESCRIPTION

An array substrate according to the embodiments of the present disclosure includes a base substrate, a dummy signal line and a conductive portion on the base substrate, an insulating layer between the dummy signal line and the conductive portion, and a via in the insulating layer, wherein the dummy signal line is connected to the conductive portion through the via to form an antenna.

Optionally, for the above array substrate provided by the embodiments of the present application, the dummy signal line includes a dummy touch signal line.

Optionally, the conductive portion includes a light shielding layer, and wherein the dummy signal line is located on a side of the light shielding layer facing away from the base substrate.

Optionally, the array substrate provided by the embodiments of the present application further includes a gate line, wherein the conductive portion includes a plurality of strip-shaped sub-conductive portions, and wherein each of the strip-shaped sub-conductive portions extends in the same direction as an extending direction of the gate line.

Optionally, the array substrate provided by the embodiments of the present application further includes a data line, wherein an extending direction of the dummy signal line is the same as an extending direction of the data line.

Optionally, for the above array substrate provided by the embodiments of the present application, the array substrate further includes a light shielding layer, and the dummy signal line is located on a side of the light shielding layer facing away from the substrate.

Optionally, for the above array substrate provided by the embodiments of the present application, the insulating layer includes a first sub-layer, a second sub-layer, and a third sub-layer sequentially disposed in a direction away from the base substrate.

Optionally, the array substrate further includes a thin film transistor at least partially located in the insulating layer.

Optionally, the thin film transistor includes a semiconductor layer between the first sub-layer and the second sub-layer, wherein an orthographic projection of the semiconductor layer on the base substrate overlaps with an orthographic projection of the light shielding layer on the base substrate.

Optionally, for the above array substrate provided by the embodiments of the present application, the thin film transistor further includes a first source/drain line and a second source/drain line on the third sub-layer, the first source/drain line being connected to the semiconductor layer via a first hole through the second sub-layer and the first sub-layer, and the second source/drain line being connected to the semiconductor layer via a second hole through the second sub-layer and the first sub-layer.

Optionally, for the above array substrate provided by the embodiments of the present application, the first sub-layer includes a buffer layer, the second sub-layer includes a gate insulating layer of the thin film transistor, and the third sub-layer includes an interlayer insulating layer.

Optionally, an orthographic projection of the antenna on the base substrate is a spiral shape.

Correspondingly, the embodiments of the present disclosure further provide a display device. The display device includes the array substrate according to any one of the above.

Correspondingly, the embodiments of the present disclosure further provide a method for driving an array substrate according to any one of the preceding claims. The method includes performing time-division driving of display driving and touch driving on the array substrate, the method further includes driving the antenna when the array substrate is not subjected to display driving and touch driving.

DETAILED DESCRIPTION

Figure 1:
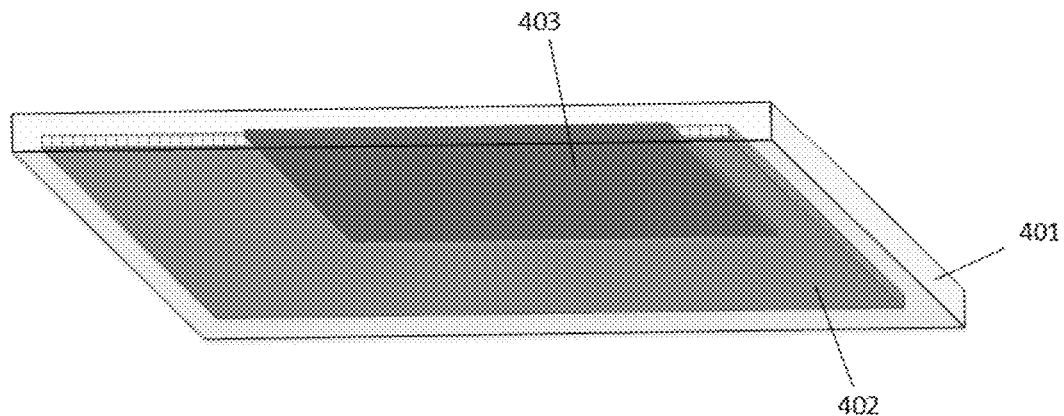
FIG. 1 is a schematic view of an antenna device in an example.

The present disclosure will be further described in detail with reference to the accompanying drawings. Obviously, the described embodiments are only a part of the embodiments of the present disclosure, and not all of the embodiments. All other embodiments obtained by a person of ordinary skill in the art based on the embodiments of the present disclosure without departing from the inventive scope are the scope of the present disclosure.

The shapes and sizes of the various components in the drawings do not reflect the true proportions, and are merely intended to illustrate the contents of the present disclosure.

When describing elements of the present disclosure and embodiments thereof, the articles "a", "an", "the" and "said" are intended to mean the presence of one or more elements. The terms "including", "comprising", "containing" and "having" are intended to be inclusive and to indicate that there may be additional elements other than the listed elements.

For the purpose of the literal description below, the terms "up", "down", "left", "right", "vertical", "horizontal", "top", "bottom" and derivatives thereof should relate to the present disclosure as denoted in the direction as in the drawings. The term "overriding", "on top of", "provided on . . . ", or "provided on top of" means that a first element such as a first structure exists on a second element such as a second structure, wherein an intermediate element such as an interface structure may exist between the first element and the second element. The term "contacting" means connecting a first element such as a first structure and a second element such as a second structure, while there may be or may not be other element at the interface of the two elements.

FIG. 1 shows an antenna device, wherein 401 is a mobile phone, 402 is a mobile phone main board, and 403 is an antenna device. Antennas used in mobile phones, especially NFC antennas, require mobile phone supplier to purchase antenna devices 403 separately. However, the antenna device 403 is externally disposed on the main board 402 of the mobile phone 401, and occupies a large space inside the mobile phone 401, which is disadvantageous to the slimness of the mobile phone.

Figure 2A:
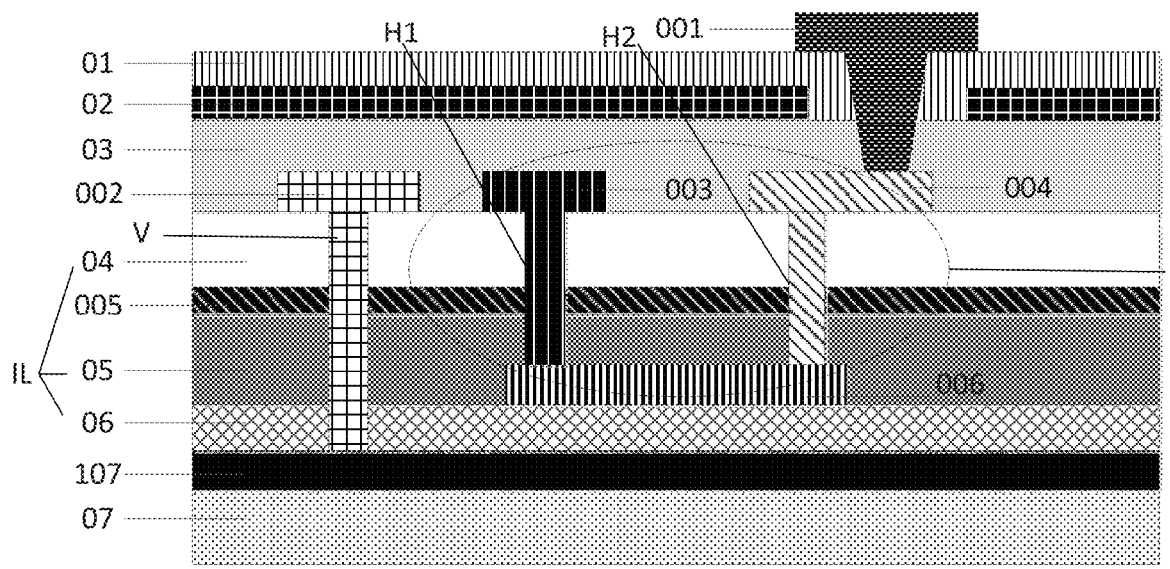
FIG. 2A is a schematic structural view (cross-sectional view) of an array substrate according to an embodiment of the present disclosure.

Embodiments of the present disclosure provide an array substrate. As shown in FIG. 2A, the array substrate according to an embodiment of the present disclosure includes a base substrate 07, a dummy signal line 002, a conductive portion 107, an insulating layer IL between the dummy signal line 002 and the conductive portion 107, and a via V which is disposed in the insulating layer IL. The dummy signal line 002 and the conductive portion 107 are connected to the conductive portion 107 through the via V. The dummy signal line 002 and the conductive portion 107 are used to form an antenna. The array substrate of the embodiments of the present disclosure can reduce the space occupied by the antenna inside the mobile phone, thereby reducing the thickness of the mobile phone and making the mobile phone thinner and lighter.

The insulating layer may include a first sub-layer (e.g., buffer layer) 06, a second sub-layer (e.g., gate insulating layer) 05, and a third sub-layer sequentially disposed in a direction away from the base substrate (e.g., interlayer insulating layer ILD) 04. The array substrate may further include a thin film transistor TFT partially located in the insulating layer. The thin film transistor TFT may include a semiconductor layer (e.g., polysilicon semiconductor) 006 disposed between the first sub-layer and the second sub-layer, a first source/drain line 003, and a second source/drain line 004 disposed on the third sub-layer. The first source/drain line 003 is connected to the semiconductor layer 006 through a first hole H1 passing through the second sub-layer and the first sub-layer. The second source/drain line 004 is connected to the semiconductor layer though the second hole H2 passing through the second sub-layer and the first sub-layer.

Embodiments of the present disclosure provide an array substrate. As shown in FIG. 2A (cross-sectional view), the array substrate includes a pixel electrode (P-ITO) 001, a pixel insulation (PVX) layer 01, a common electrode (C-ITO) layer 02, a planarization (PLN) layer 03, a dummy signal line (e.g., dummy touch signal line) 002, a first source/drain line 003, a second source/drain line 004, a gate line 005, a polysilicon (P-Si) semiconductor layer 006, an interlayer insulating (ILD) layer 04, a gate insulating (GI) layer 05, a buffer insulating layer 06, a conductive portion 107, and a base substrate (lower substrate) 07. A light shield (LS) can be used as the conductive portion.

The cross-sectional view described in the embodiments of the present disclosure refers to a cross section view taken along the extending direction of the gate line in the plane of the array substrate.

The dummy signal line 002 is connected to the conductive portion 107 through a via V in the ILD layer 04, the GI layer 05, and the buffer layer 06 to form an antenna.

In the embodiments of the present disclosure, the antenna is integrated on the array substrate. The dummy signal line and the conductive portion on the array substrate in the mobile phone are connected through the via in the layer structure to form an antenna. Therefore, the space occupied by the antenna inside the mobile phone is reduced and the thickness of the mobile phone is reduced as well, making the mobile phone thinner and lighter.

Further, in specific implementations, in the above array substrate provided by the embodiments of the present disclosure, the orthographic projection of the antenna on the base substrate is spiral.

Figure 2B:
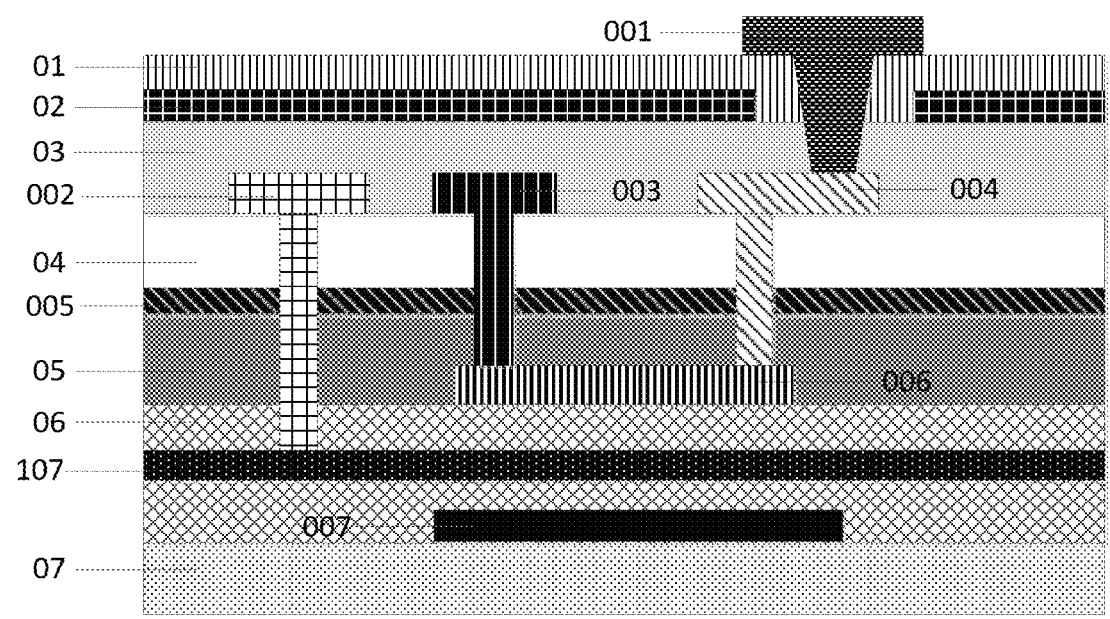
FIG. 2B is a schematic structural view (cross-sectional view) of an array substrate according to an embodiment of the present disclosure.

Further, in the above array substrate provided by the embodiments of the present disclosure, the light shielding layer can be used as the conductive portion 107 (as shown in FIG. 2A). That is, the original light shielding layer is made into a strip-shaped conductive portion 107, and the dummy signal line 002 is connected to the conductive portion 107 through via holes in the ILD layer 04, the GI layer 05, and the buffer layer 06 to form an antenna. But the embodiments are not limited thereto. An additional conductive portion 107 (as shown in FIG. 2B, in addition to the light shielding layer 007, a conductive portion 107 is additionally provided) may be disposed in the insulating layer IL (for example, including the ILD layer 04, the GI layer 05, and the buffer layer 06) to connect with dummy signal line (e.g., dummy touch signal line) 002 to form an antenna through the via in the ILD layer 04, the GI layer 05, and the buffer layer 06. The other reference numerals in FIG. 2B are the same as those shown in FIG. 2A.

It should be noted that, the present disclosure is not limited herein. The specific implementation may be designed according to requirements, as long as the antenna is formed by using the metal layer and the dummy signal line in the array substrate which complies with the principle of the present disclosure.

Figure 3:
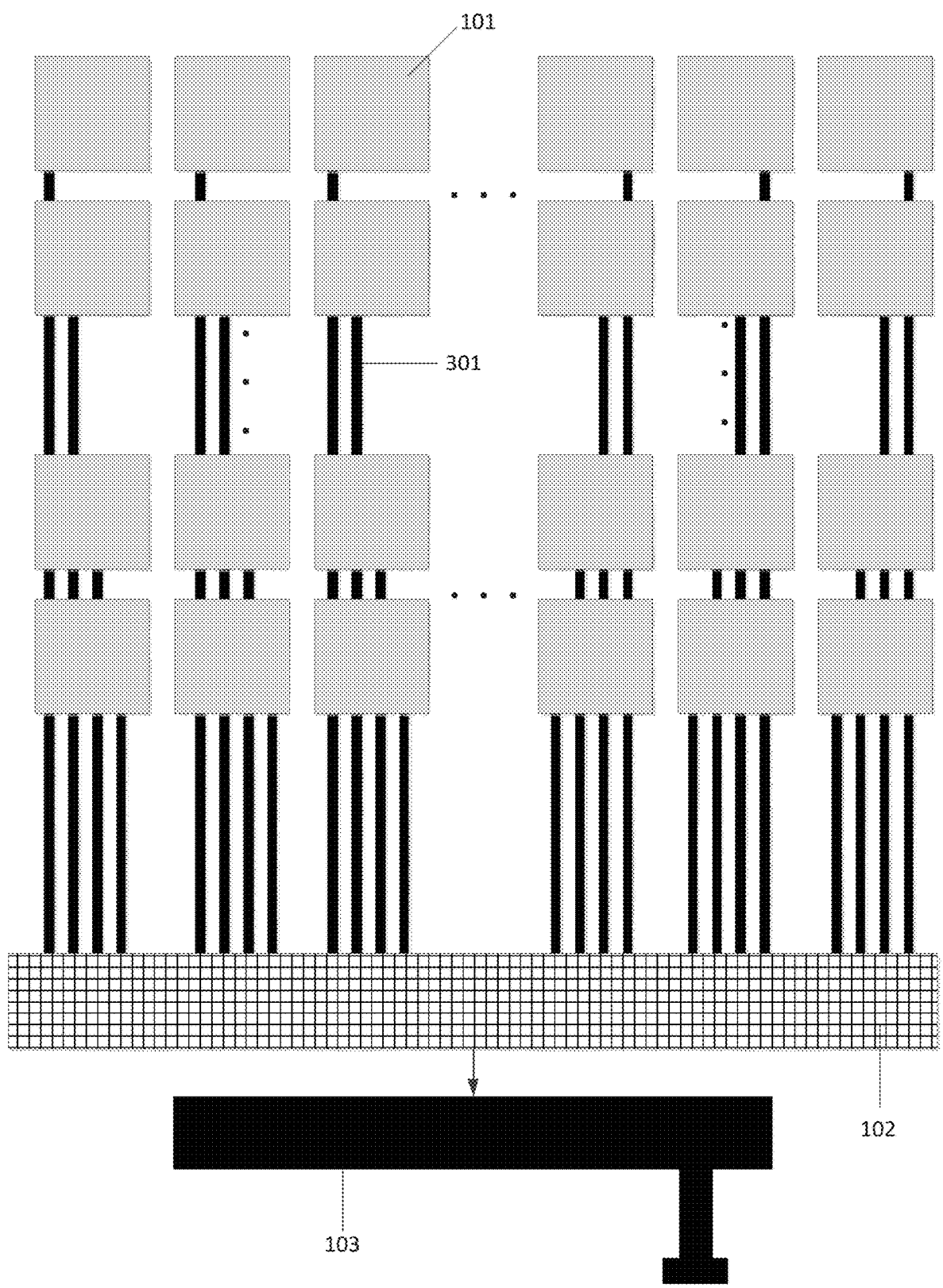
FIG. 3 is a schematic structural view of an array substrate in a Full In Cell technology.
Figure 4:
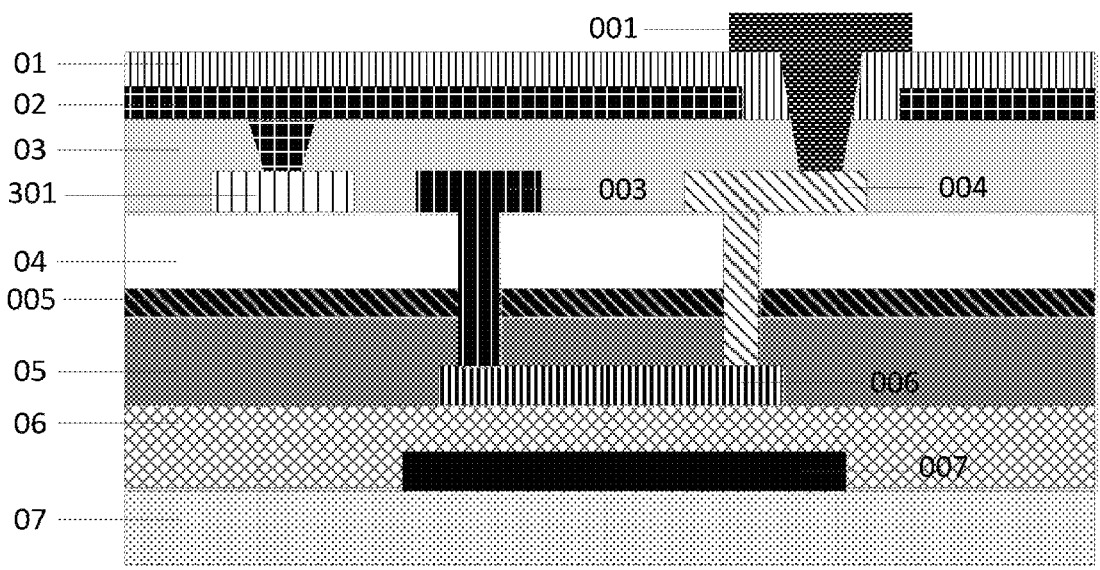
FIG. 4 is a schematic structural view (cross-sectional view) of a TPM of an array substrate in an example.

The Full In Cell (FIC) technology has become the production trend of the major panel manufacturers. As shown in FIG. 3, for the structure of the FIC product, the common electrode 101 is divided into a plurality of block structures. The block structures are connected to the Touch Panel Metal (TPM) line 301 through PLN holes in the PLN layer, and then connected to the IC bonding pad 103 through an integrated circuit pin (IC PIN) 102 to be introduced into a fanout area. The specific structures are shown in FIG. 4

Figure 5:
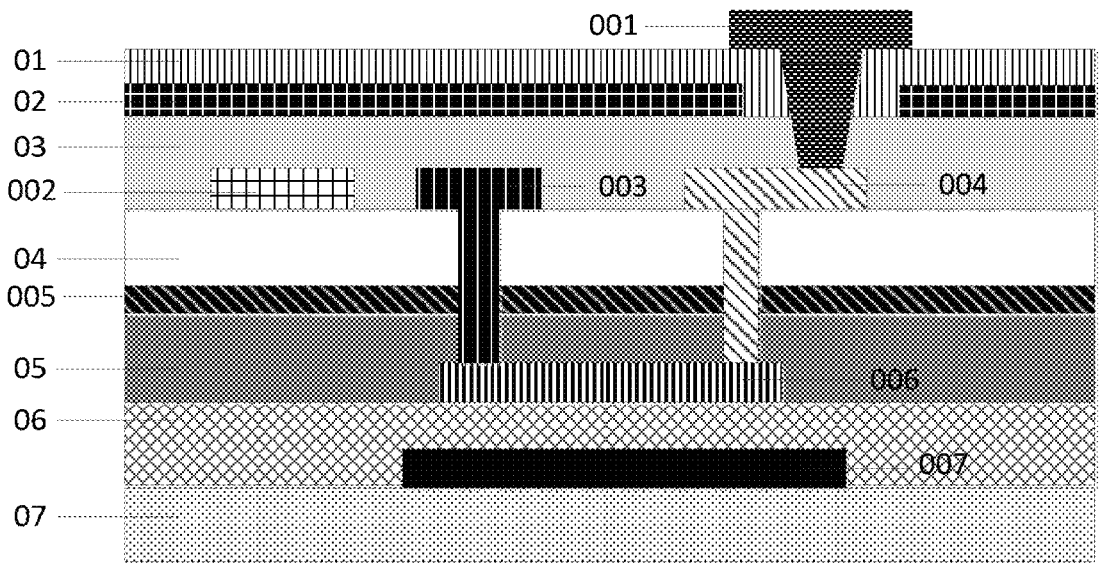
FIG. 5 is a schematic structural view (cross-sectional view) of a dummy TPM of an array substrate in an example.
Figure 6:
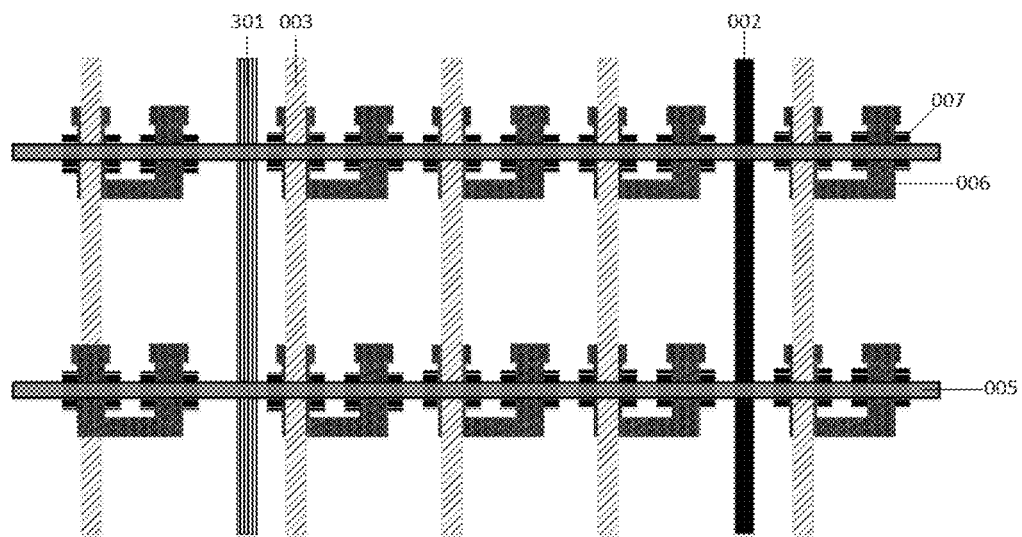
FIG. 6 is a schematic structural view (top view) of an array substrate in an example.

(cross-sectional view), FIG. 5 (cross-sectional view), and FIG. 6 (top view). The cross-sectional view shown in FIG. 4 refers to a cross-section view taken along the extending direction of the gate line in the plane of the array substrate and at the portion where the TPM line is located. The cross-sectional view shown in FIG. 5 refers to a cross-section view taken along the extending direction of the gate line in the plane of the array substrate and at a portion where the dummy signal line (for example, the dummy touch signal line) 002 is located. There is a signal line (e.g., a touch signal line) line 301 between every two adjacent pixels for transmitting a touch signal of the touch screen. In order to ensure that the display of the circuit and the screen is not affected by the uneven distribution of the lines, a dummy signal line 002 is disposed next to each touch signal line 301 with a pixel unit interval to ensure uniformity within the screen (as shown in FIG. 6). Each pixel unit has three sub-pixels which are red sub-pixel, green sub-pixel, and blue sub-pixel. The dummy signal line 002 has no connection relationship with the LS layer 007 (as shown in FIG. 5), and is only used to ensure uniformity in the screen. The dummy signal line 002 does not receive the touch signal. The dummy signal line thus can be connected to the LS layer without any adverse effect on the original function. Moreover, as shown in FIG. 6, the LS layer 007 includes a plurality of block structures which are respectively disposed under each of the P-Si semiconductor layers 006 for shielding the respective P-Si semiconductor layer 006 from light leakage. The area of the LS should be sufficient to block the P-Si semiconductor layer 006. Therefore, the LS layer can be formed into a strip shape without adversely affecting the product. Other reference numerals in FIG. 4, FIG. 5, and FIG. 6 are consistent with those of the devices depicted in FIG. 2A.

The top view described in the embodiments of the present disclosure refers to a view obtained by orthographic projection from the top to the bottom. Herein, "from top to bottom" means a direction from the dummy signal line toward the base substrate.

In the above array substrate provided by the embodiments of the present disclosure, the conductive portion 007 is made into a plurality of strip structures. As shown in FIG. 2A (cross-sectional view) and FIG. 7 (top view), the dummy signal line 002 is connected to the strip-shaped conductive portion 007 through a via hole forming an antenna as indicated by a white dotted arrow in FIG. 7. The extending direction of the strip-shaped conductive portion 007 is perpendicular to the extending direction of the dummy signal line. Other reference numerals in FIG. 7 are consistent with those of the devices depicted in FIG. 2A.

Figure 7:
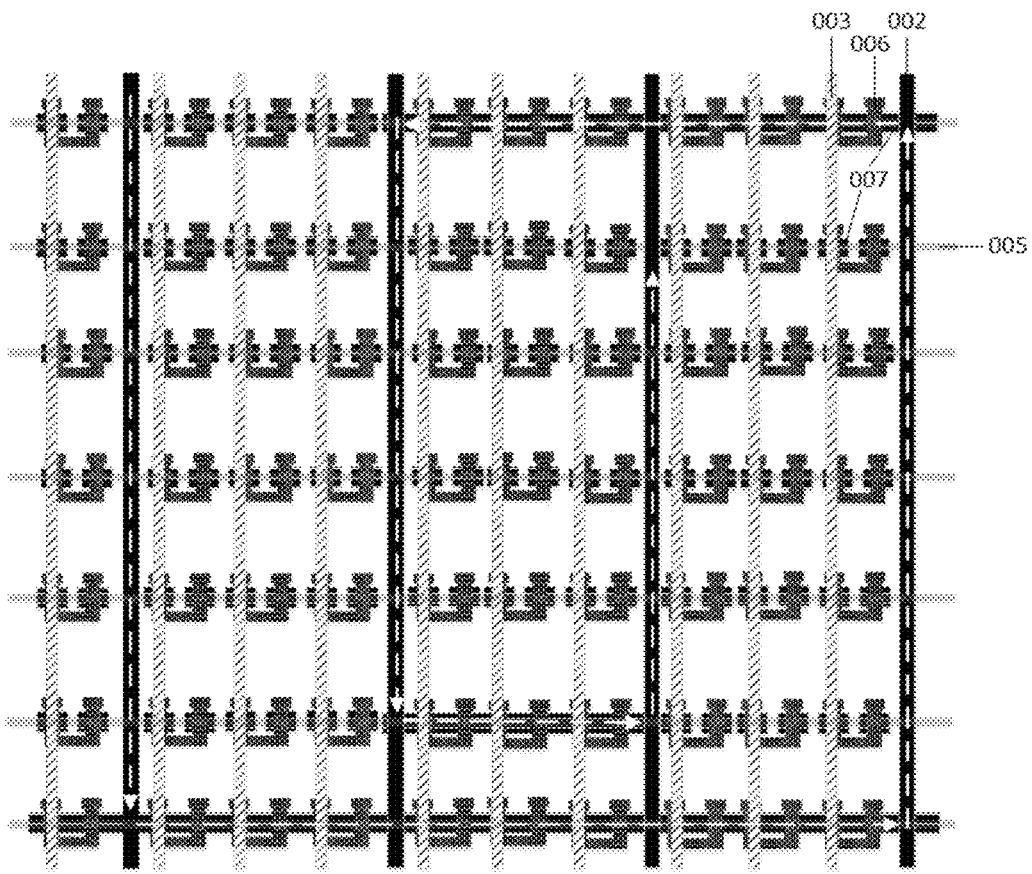
FIG. 7 is a schematic structural view (top view) of an array substrate according to an embodiment of the present disclosure.

It should be noted that the shape of the NFC antenna in FIG. 7 is exemplary. The shape of the antenna formed by connecting the dummy signal line 002 through the via with the strip-shaped conductive portion 007 in FIG. 7 is just to illustrate the principle. The shape of the antenna coil is not limited to a ring shape, and may be any shape. For example, it may be a curved shape. Specifically, antenna coil may be designed into different shapes according to the requirements of functions (such as WIFI, Bluetooth, etc.), and is not limited herein.

It should be noted that the dummy signal line 002 does not receive the touch signal. Specifically, in the embodiments of the present disclosure, the array substrate may include at least one signal line or a plurality of signal lines between two adjacent dummy signal lines 002, which may be specifically set as needed, and are not limited herein.

Further, in specific implementations, in the above array substrate provided by the embodiments of the present disclosure, the LS layer in the related art is formed into a plurality of strip structures without an additional mask in the process flow. It only needs to change the planar LS in the original process to the strip LS when drawing the LS layer MASK. On the other hand, in the array process, the depth of the ILD hole is increased when etching the ILD layer 04, such that the via pass through the GI layer 05 and the buffer layer 06 and arrives at the LS layer 007. The length of the strip LS layer 007 can be designed according to the needs of different antennas, and is not limited herein.

Further, in the above array substrate provided by the embodiments of the present disclosure, the array substrate includes a plurality of strip LS layers. Each strip LS layer may correspond to a row of pixels or a plurality of rows of pixels.

Further, in the above array substrate provided by the embodiments of the present disclosure, the array substrate includes a plurality of dummy signal lines. Each dummy signal line may correspond to a column of pixels or a plurality of columns of pixels.

Further, in the above array substrate provided by the embodiments of the present disclosure, the conductive portion 007 includes a plurality of strip-shaped sub-conductive connection portions 007. The extending direction of each strip-shaped sub-conductive connection portion 007 is the same as the extending direction of the gate line 005.

Further, in the above array substrate provided by the embodiments of the present disclosure, the extending direction of the dummy signal line 002 is the same as the extending direction of the first source/drain line 003 (i.e., the data line).

Further, in the above array substrate provided by the embodiments of the present disclosure, the via for connecting the dummy signal line 002 and the strip LS layer 007 is disposed in the layer structure. The layer structure may include, for example, the first sub-layer, the second sub-layer, and the third sub-layer.

Further, in specific implementations, for the above array substrate provided by the embodiments of the present disclosure, the first sub-layer may be, for example, an ILD layer 04, the second sub-layer may be, for example, a GI layer 05, the third sub-layer may be, for example, the buffer layer 06. The ILD layer 04 serves to insulate the dummy signal line 002, the first source/drain line 003, and the second source/drain line 004 from the gate line 005. The GI layer 05 serves to insulate the gate line 005 from the P-Si semiconductor layer 006. The buffer layer 06 serves to insulate the P-Si semiconductor layer 006 from the conductive portion 007.

Further, in specific implementations, for the above array substrate provided by the embodiments of the present disclosure, a plurality of first source/drain lines 003 and second source/drain lines 004 which are disposed in the same layer as the dummy signal line 002 may be disposed on the ILD layer 04.

Further, in specific implementations, for the above array substrate provided by the embodiments of the present disclosure, a plurality of gate lines 005 may be disposed on the GI layer 05.

Further, in specific implementations, for the above array substrate provided by the embodiments of the present disclosure, a plurality of P-Si semiconductor layers 006 may be disposed on the buffer layer 06.

Further, in specific implementations, for the above array substrate provided by the embodiments of the present application, the first source/drain line 003 and the second source/ drain line 004 may be connected to the P-Si semiconductor layer 006 through a via in the ILD layer 04 and the GI layer 05.

Further, in specific implementations, for the above array substrate provided by the embodiments of the present disclosure, a common electrode layer 02 is disposed on the PLN layer 03. The common electrode layer 02 may be connected to the TPM line through a via in the PLN layer to transmit the touch signal.

Further, in specific implementations, for the array substrate provided in the embodiments of the present disclosure, a pixel electrode 001 and a PVX layer 01 for insulating the pixel electrode 001 from the common electrode layer 02 are disposed on the common electrode layer 02.

Further, in specific implementations, for the above array substrate provided by the embodiments of the present disclosure, the pixel electrode 001 is connected to the drain line 004 through a via disposed in the PVX layer 01, the common electrode layer 02 and the PLN layer 03 for driving the pixel circuit.

Figure 8:
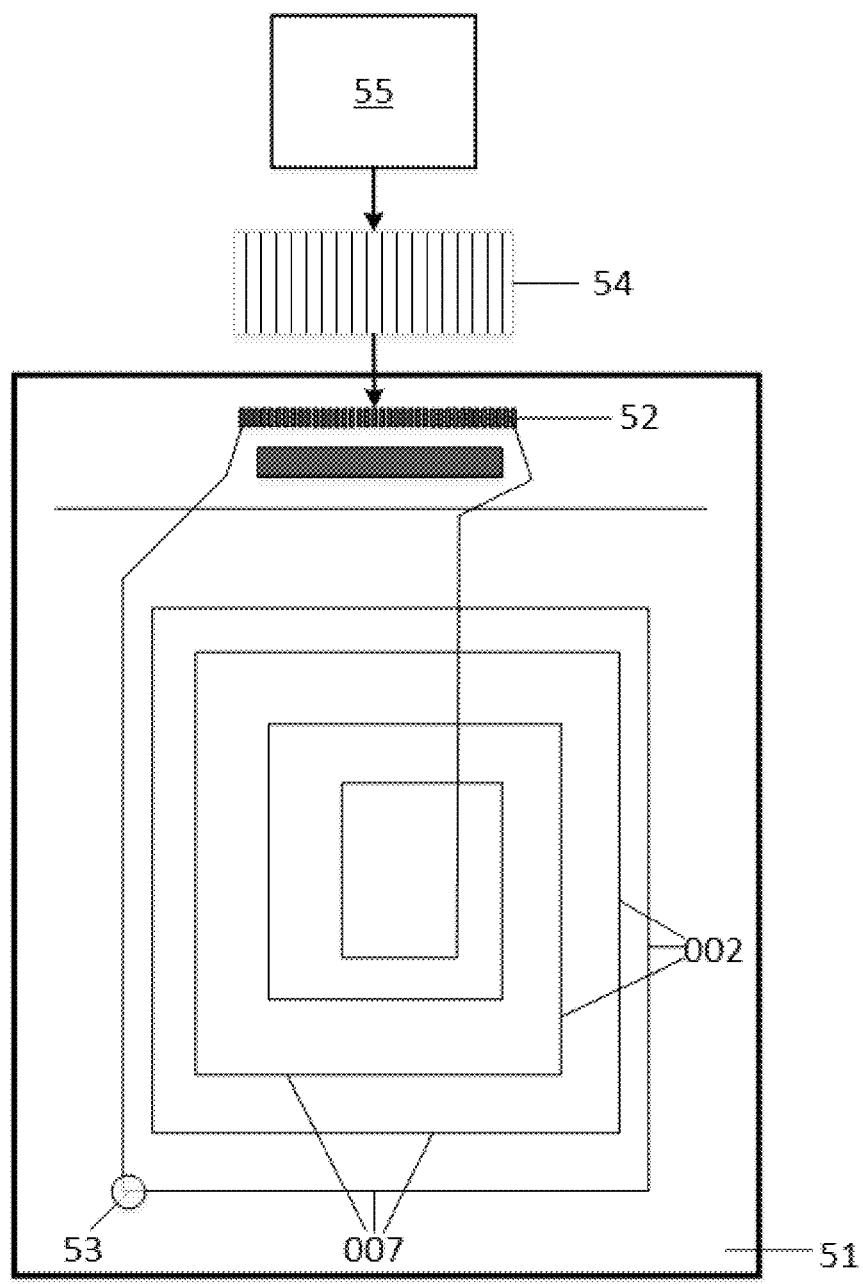
FIG. 8 is a schematic view (top view) of an array substrate according to an embodiment of the present disclosure.

Further, in the specific implementations, the shape of the NFC antenna is taken as an example. As shown in FIG. 8 (only the dummy TPM line and the LS line in the array substrate are reserved for brief description), for the above array substrate provided in the embodiments of the present disclosure, the lateral antennas in the antennas (for example, antenna coils) on the array substrate 51 in the figure are all LS layers 007, and vertical antennas are all dummy signal lines 002. The dummy signal line 002 and the LS layer 007 are connected to each other through a via 53 (the intersection of all the lateral antennas and the vertical antenna in the figure is the via 53) to form an antenna. The antenna is connected to the FPC Bonding pad 52 on the array substrate by an external trace. An FPC connecter 54 is connected to the FPC Bonding pad 52, and the antenna is connected to the main board 55 by the FPC connecter 54. The main board drives the antenna to work.

The embodiments of the present disclosure further provide a method for driving an array substrate. The method includes performing time-division driving of display driving and touch driving on the array substrate. The method further includes driving the antenna formed by the dummy signal line and the conductive portion when the array substrate is not subjected to display driving and touch driving. Further, in specific implementations, for the above array substrate driving method provided by the embodiments of the present disclosure, the main board 55 performs time-division driving consisting three segments of display, touch, and blanking. Therefore, in a cycle, after the time-division driving of display driving and touch driving on the array substrate, the antenna driving may be performed in the blanking period. In this way, the interference or influence on the display state and the touch state of the display panel can be directly avoided. Of course, the antenna driving can also be performed in any stage of the driving period or whole driving period and adjustment may be performed later without affecting the function of the array substrate according to the embodiments of the present disclosure. The antenna driving is not limited herein.

Figure 9:
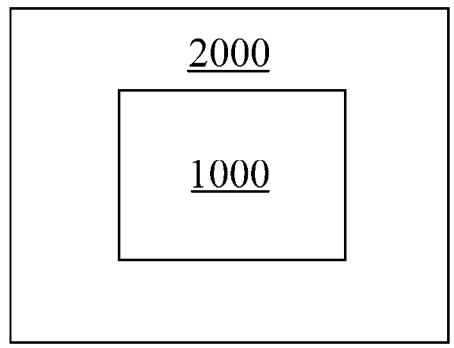
FIG. 9 is a schematic view of a display device according to an embodiment of the present disclosure.

Based on the same inventive concept, the embodiments of the present disclosure further provide a display device. The display device includes the above-mentioned array substrate according to the embodiments of the present disclosure. FIG. 9 is a schematic view of a display device according to an embodiment of the present disclosure. As shown in FIG. 9, the display device 2000 includes an array substrate 1000. The array substrate 1000 may be any array substrate shown in FIG. 2A, FIG. 2B, FIG. 7, and FIG. 8. The display device can be any product or component having a display function, such as a mobile phone, a tablet computer, a television, a display, a notebook computer, a digital photo frame, a navigator, and the like. Other indispensable components of the display device are understood by those skilled in the art, and are not described herein. Nor should they be construed as limiting the present disclosure. For the implementations of the display device, reference may be made to the embodiments of the above package structure, and the repeated description is omitted.

In summary, the embodiments of the present disclosure provide an array substrate, a driving method, and a display device. The antenna is integrated on the array substrate by connecting a dummy signal line and a conductive portion in the array substrate through a via to form the antenna. The space occupied by the antenna inside the mobile phone is reduced, thus the thickness of the mobile phone is reduced and the mobile phone is made lighter and thinner. No additional process is added in the process, and no cost is increased in the production process of the array substrate.

It will be apparent to those skilled in the art that various modifications and changes can be made in the present disclosure without departing from the spirit and scope of the disclosure. Thus, it is intended that the present disclosure cover the modifications and variations of the present disclosure.

What is claimed is:

1. An array substrate comprising:
   a base substrate;
   touch signal lines configured to receive or transmit a touch signal to perform a touch functionality;
   a dummy touch signal line and a conductive portion on the base substrate, wherein the dummy touch signal line does not receive or transmit a touch signal and is arranged in a same layer as the touch signal lines, and wherein the dummy touch signal line and the conductive portion are used as an antenna;
   an insulating layer between the dummy touch signal line and the conductive portion;
   a via in the insulating layer, wherein, the dummy touch signal line is connected to the conductive portion through the via to form the antenna;
   a thin film transistor at least partially located in the insulating layer, wherein the thin film transistor comprises a semiconductor layer; and
   a light shielding layer between the base substrate and the semiconductor layer, wherein an orthographic projection of the semiconductor layer on the base substrate overlaps with an orthographic projection of the light shielding layer on the base substrate, wherein the dummy touch signal line is located on a side of the light shielding layer facing away from the base substrate, and wherein i) the light shielding layer is used as the conductive portion, or ii) the conductive portion is between the semiconductor layer and the light shielding layer.

2. The array substrate according to claim 1, further comprising a gate line, wherein the conductive portion includes a plurality of strip-shaped sub-conductive portions, and wherein each of the strip-shaped sub-conductive portions extends in the same direction as an extending direction of the gate line.

3. A method for driving an array substrate according to claim 2, the method comprising performing time-division driving of display driving and touch driving on the array substrate, the method further comprising:

driving the antenna when the array substrate is not subjected to display driving and touch driving.

4. The array substrate according to claim 1, further comprising a data line, wherein an extending direction of the dummy touch signal line is the same as an extending direction of the data line.

5. A method for driving an array substrate according to claim 4, the method comprising performing time-division driving of display driving and touch driving on the array substrate, the method further comprising:
driving the antenna when the array substrate is not subjected to display driving and touch driving.

6. The array substrate according to claim 1, wherein the insulating layer comprises a first sub-layer, a second sub-layer, and a third sub-layer sequentially disposed in a direction away from the base substrate.

7. The array substrate according to claim 6, wherein the semiconductor layer is between the first sub-layer and the second sub-layer.

8. The array substrate according to claim 7, wherein the thin film transistor further comprises a first source/drain line and a second source/drain line on the third sub-layer, wherein the first source/drain line is connected to the semiconductor layer via a first hole through the second sub-layer and the first sub-layer, and wherein the second source/drain line is connected to the semiconductor layer via a second hole through the second sub-layer and the first sub-layer.

9. A method for driving an array substrate according to claim 7, the method comprising performing time-division driving of display driving and touch driving on the array substrate, the method further comprising:
driving the antenna when the array substrate is not subjected to display driving and touch driving.

10. The array substrate according to claim 6, wherein the first sub-layer comprises a buffer layer;
wherein the second sub-layer includes a gate insulating layer of the thin film transistor; and
wherein the third sub-layer includes an interlayer insulating layer.

11. A method for driving an array substrate according to claim 6, the method comprising performing time-division driving of display driving and touch driving on the array substrate, the method further comprising:
driving the antenna when the array substrate is not subjected to display driving and touch driving.

12. The array substrate according to claim 1, wherein an orthographic projection of the antenna on the base substrate is a spiral shape.

13. A display device comprising the array substrate according to claim 1.

14. A method for driving an array substrate according to claim 1, the method comprising performing time-division driving of display driving and touch driving on the array substrate, the method further comprising:
driving the antenna when the array substrate is not subjected to display driving and touch driving.

15. An array substrate comprising:
a base substrate;
touch signal lines configured to receive or transmit a touch signal to perform a touch functionality;
a dummy touch signal line, and a conductive portion on the base substrate, wherein the dummy touch signal line does not receive or transmit a touch signal, wherein the touch signal lines and the dummy touch signal line are arranged in parallel, and wherein the dummy touch signal line and the conductive portion are used as an antenna;
an insulating layer between the dummy touch signal line and the conductive portion;
a via in the insulating layer, wherein the dummy touch signal line is connected to the conductive portion through the via to form an antenna;
a thin film transistor at least partially located in the insulating layer, wherein the thin film transistor comprises a semiconductor layer; and
a light shielding layer between the base substrate and the semiconductor layer, wherein an orthographic projection of the semiconductor layer on the base substrate overlaps with an orthographic projection of the light shielding layer on the base substrate, wherein the dummy touch signal line is located on a side of the light shielding layer facing away from the base substrate, and wherein i) the light shielding layer is used as the conductive portion, or ii) the conductive portion is between the semiconductor layer and the light shielding layer.

* * * * *